United States Patent
Refai-Ahmed

(10) Patent No.: US 7,965,511 B2
(45) Date of Patent: Jun. 21, 2011

(54) CROSS-FLOW THERMAL MANAGEMENT DEVICE AND METHOD OF MANUFACTURE THEREOF

(75) Inventor: Gamal Refai-Ahmed, Markham (CA)

(73) Assignee: ATI Technologies ULC, Markham, Ontario (CA)

(*) Notice: Subject to any disclaimer, the term of this patent is extended or adjusted under 35 U.S.C. 154(b) by 0 days.

(21) Appl. No.: 11/465,421

(22) Filed: Aug. 17, 2006

(65) Prior Publication Data

US 2008/0043438 A1 Feb. 21, 2008

Related U.S. Application Data

(62) Division of application No. 11/465,406, filed on Aug. 17, 2006.

(51) Int. Cl.
- *H05K 7/20* (2006.01)
- *F28F 7/00* (2006.01)
- *H01L 23/34* (2006.01)
- *H01B 9/06* (2006.01)

(52) U.S. Cl. ........ 361/700; 361/699; 361/698; 361/703; 361/679.53; 361/697; 165/80.4; 165/80.5; 165/104.33; 257/715; 257/722; 174/15.1; 174/16.3

(58) Field of Classification Search .................. 361/699, 361/700, 703; 257/714–715, 722; 174/15.1, 174/15.2, 252, 16.3; 165/80.3–80.5, 104.33
See application file for complete search history.

(56) References Cited

U.S. PATENT DOCUMENTS

| | | | | |
|---|---|---|---|---|
| 4,145,708 A * | 3/1979 | Ferro et al. | ..................... | 257/715 |
| 4,523,636 A * | 6/1985 | Meijer et al. | ............. | 165/104.26 |
| 5,198,889 A * | 3/1993 | Hisano et al. | ................. | 257/678 |
| 5,216,580 A * | 6/1993 | Davidson et al. | ............. | 361/700 |
| 5,386,143 A * | 1/1995 | Fitch | ............................. | 257/715 |
| 5,704,416 A * | 1/1998 | Larson et al. | ............. | 165/104.33 |
| 5,848,637 A * | 12/1998 | Lee | .......................... | 165/104.21 |
| 6,062,302 A * | 5/2000 | Davis et al. | ............. | 165/104.26 |
| 6,181,556 B1 | 1/2001 | Allman | | |
| 6,237,223 B1 * | 5/2001 | McCullough | ........... | 29/890.032 |
| 6,394,175 B1 | 5/2002 | Chen et al. | | |
| 6,410,982 B1 * | 6/2002 | Brownell et al. | ............. | 257/714 |

(Continued)

FOREIGN PATENT DOCUMENTS

DE 202005017349 1/2006

(Continued)

OTHER PUBLICATIONS

D. Van Heerden, T.R. Rude, J. Newson, J. He, E. Besnoin, O.M. Knio, and T.P. Weihs; "A Tenfold Reduction in Interface Thermal Resistance for Heat Sink Mounting"; IMAPS Symposium; 2003.*

(Continued)

*Primary Examiner* — Zachary M Pape
(74) *Attorney, Agent, or Firm* — Vedder Price P.C.

(57) ABSTRACT

The present disclosure relates to heat transfer thermal management device utilizing varied methods of heat transfer to cool a heat generating component from a circuit assembly or any other embodiment where a heat generating component can be functionally and operatively coupled. In an embodiment, the vapor configuration is modified to include fins that define a cross-flow heat exchanger where the vapor from the vapor chamber serves as the fluid in the vertical cross-flow in the heat exchanger and natural or forced cooling air serves as the horizontal cross-flow for the heat exchanger.

15 Claims, 9 Drawing Sheets

U.S. PATENT DOCUMENTS

| | | | |
|---|---|---|---|
| 6,490,160 B2 * | 12/2002 | Dibene, II et al. | 361/700 |
| 6,550,531 B1 * | 4/2003 | Searls et al. | 165/104.33 |
| 6,650,544 B1 | 11/2003 | Lai | |
| 6,745,824 B2 | 6/2004 | Lee et al. | |
| 6,863,119 B2 * | 3/2005 | Sugito et al. | 165/104.33 |
| 6,882,051 B2 | 4/2005 | Majumdar et al. | |
| 6,910,794 B2 * | 6/2005 | Rice | 362/547 |
| 6,978,829 B1 | 12/2005 | Lin | |
| 7,269,014 B1 | 9/2007 | Zhao et al. | |
| 7,278,470 B2 | 10/2007 | Xia et al. | |
| 7,327,576 B2 | 2/2008 | Lee et al. | |
| 7,370,693 B2 | 5/2008 | Lin | |
| 7,382,047 B2 | 6/2008 | Chen et al. | |
| 2002/0021556 A1 * | 2/2002 | Dibene et al. | 361/704 |
| 2002/0056908 A1 * | 5/2002 | Brownell et al. | 257/714 |
| 2002/0118511 A1 | 8/2002 | Dujari et al. | |
| 2003/0164289 A1 | 9/2003 | Weihs et al. | |
| 2004/0165350 A1 | 8/2004 | Fan | |
| 2004/0174651 A1 * | 9/2004 | Aisenbrey | 361/103 |
| 2005/0028965 A1 | 2/2005 | Chen | |
| 2005/0051607 A1 | 3/2005 | Wang et al. | |
| 2005/0103476 A1 | 5/2005 | Chen et al. | |
| 2005/0126766 A1 * | 6/2005 | Lee et al. | 165/133 |
| 2005/0173098 A1 | 8/2005 | Connors | |
| 2006/0037738 A1 | 2/2006 | Li et al. | |
| 2006/0144574 A1 | 7/2006 | Rosenfeld et al. | |
| 2006/0196640 A1 * | 9/2006 | Siu | 165/104.26 |
| 2008/0043437 A1 | 2/2008 | Refai-Ahmed | |

FOREIGN PATENT DOCUMENTS

| | | |
|---|---|---|
| WO | 2006033875 | 3/2006 |

OTHER PUBLICATIONS

Levin, J., "Room Temperature Soldering of Connectors to PCB Using Reactive Multilayer Foils," [2005], N. P.

"MCHX Technology," N. D., N. P.

"Advancing Industrial Joining with Nanotechnology," Reactive NanoTechnologies, N. D., Hunt Valley, ND.

"Innovative Fluidics Thermal Management Solutions," downloaded from www.innovativefluidics.com on Aug. 17, 2006.

"Breakthrough Superlattice Technology," downloaded from www.nextremetheremal.com on Aug. 17, 2006.

"Refined Cooling for Video Cards, pts. 1 and 2" downloaded from www.digit-life.com on Aug. 17, 2006.

International Search Report; European Patent Office; for International Application No. PCT/IB2007/002351; dated Jan. 16, 2008.

\* cited by examiner

CROSS-FLOW THERMAL MANAGEMENT DEVICE AND METHOD OF MANUFACTURE THEREOF

CROSS-REFERENCE TO RELATED CO-PENDING APPLICATION

This application is a divisional application of co-pending application Ser. No. 11/465,406, filed on Aug. 17, 2006, having Gamal Refai-Ahmed as the inventor, owned by instant assignee, and is incorporated herein by reference.

FIELD OF THE INVENTION

The present invention generally relates to thermal management of electronic components, and more particularly, to thermal management devices that employ liquid chambers.

BACKGROUND OF THE INVENTION

Electronic components such as integrated circuit chips produce heat during operation. These components may be mounted on circuit substrates to form circuit assemblies. These assemblies are often confined within casings where convective air cooling is hampered. Cooling solutions are necessary for certain electronic components to maintain operational temperatures below a critical level, which, if reached, may damage the electronic component or reduce its efficiency or effectiveness. Thermal management devices are mounted to the electronic component to be cooled and drain heat from the component by heat conduction, heat convection or heat irradiation. Ultimately, the heat from the component is drained to the surrounding air in a forced or natural flow of air. Various cooling solutions are well known in the art. For example, a heat sink typically made of copper or aluminum can be attached to the outer surface of the electronic component with a thermal adhesive. The heat generated by the electronic component is then drained from the electronic component onto another colder heat sink by conduction. The conductive adhesive may be a thermal conductor that allows for heat transfer while offering some degree of resistance to the heat flux. The heat sink in turn transfers the heat to the surrounding air via natural or forced convection. One forced convection method includes the use of a fan placed near or on the heat sink to increase the air flow near over the heat sink. Another forced convection method includes cooling the air itself using an air-cooling system that forces movement of the convective structure within the air.

Known conductive and convective air-cooling methods, however, fail to provide adequate heat removal for certain electronic devices that use intensive heat generating components or require intense local cooling. In electronic devices, components may require cooling to lower surface temperatures to maintain the component efficiency. The surface of components may also heat unevenly, creating hot spots that, unless cooled locally, reduce the overall efficiency of the thermal management device by reducing the average temperature difference between the component surface and the device before the component surface temperature reaches a critical level. Improved efficiency of new thermal management devices for small heating components used in electronic devices is limited where the internal space between the various components is of known and recognized usefulness.

One method of cooling electronic components uses an evaporation and condensation cycle within a closed body to transfer heat from a hot surface of the body to a cold surface of the body. A volume of fluid, along with a pressurized volume of gas, is housed in a closed conductive volume called a vapor chamber. The fluid contacts a first surface of the volume at temperatures above the boiling point of the fluid at the determined pressure. The fluid absorbs the heat from the surface and evaporates. Local ebullition also creates fluidic convective movements inherently designed to further improve local heat transfer. The vapor then migrates by pressure differential to another part of the conductive volume and condenses on a second surface at a temperature below the boiling point of the fluid at the determined pressure. During condensation of the gas, heat is transferred to the second surface, effectively closing the thermal cycle and transferring heat from a hot surface to a cold surface. Water and water vapor may be used along with a neutral gas such as nitrogen when component surfaces to be cooled are located in the range of the boiling point of water at the selected air pressure. What is known in the art is the use of a simplified geometry to form vapor chambers, such as flat rectangular shapes or cylindrical tubes known as heat pipes. Other cooling methods include but are not limited to the use of large conductive bodies able to store and displace heat in contact with a hot body such as a heat sink, the use of thin fins made of thermal conductors arranged along successive layers to increase the surface contact area between the heated surface and the colder air, the use of cross-flow heat-exchangers where a hot gas is transported along a first flow direction in thermal communication with a cold gas flowing in a second flow direction, the use of thermoelectric cooling where heat is transferred between successive layers of different materials once an electrical potential is created between the layers, and the use of a thermotunnel cooling method where electronic flux of electrons in a tunnel removes heat from surrounding atoms.

These cooling methods from the prior art, if used individually, can fail to address one or more of the problems of increased heat fluxes, limited encumbrance, limited convective air flow, reduced heating surfaces, and colder junction temperatures requirements. What is unknown and needed is an improved thermal management device, a circuit assembly equipped with an improved thermal management device, and a method of manufacture thereof.

BRIEF DESCRIPTION OF THE DRAWINGS

The features of the present disclosure are believed to be novel and are set forth with particularity in the appended claims. The disclosure may best be understood by reference to the following description taken in conjunction with the accompanying drawings, and the figures that employ like reference numerals identify like elements.

DETAILED DESCRIPTION

Figure 1:
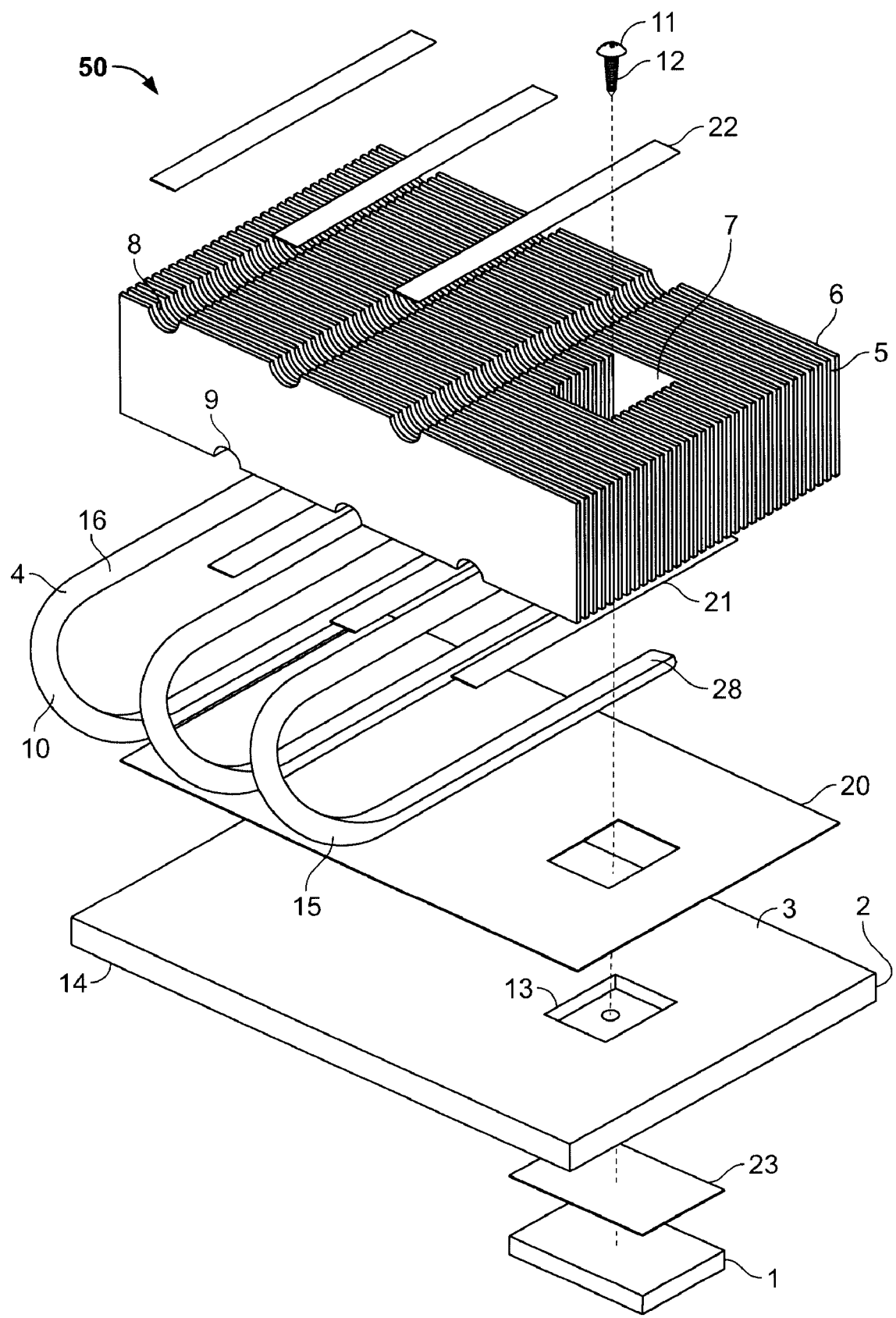
FIG. 1 is a three-dimensional exploded view of a thermal management device of a possible embodiment in accordance with the teachings of the present disclosure.

In the following detailed description, reference is made to the accompanying drawings that show, by way of illustration, several embodiments of the disclosure, each centered around an improved thermal management device based on vapor chamber technology. These embodiments are described with sufficient detail to enable one skilled in the art to practice the disclosure. It is understood that the various embodiments of the disclosure, although different, are not necessarily exclusive and can be combined differently because they show novel features. For example, a particular feature, structure, heat dissipation vehicle, or characteristic described in connection with one embodiment may be implemented within other embodiments without departing from the spirit and scope of the disclosure. In addition, it is understood that the location and arrangement of individual elements, such as geometrical parameters, within each disclosed embodiment may be modified without departing from the spirit and scope of the disclosure. Other variations will also be recognized by one of ordinary skill in the art. The following detailed description is, therefore, not to be taken in a limiting sense.

The present disclosure relates to a heat transfer thermal management device, an associated circuit assembly, and a method of manufacture utilizing varied methods of heat transfer to cool a heat generating component from a circuit assembly or any other embodiment where a heat generating component can be functionally and operatively coupled. In a proposed embodiment, the vapor configuration is modified to include fins that define a cross-flow heat exchanger there the vapor from the vapor chamber serves as the fluid in the vertical cross-flow in the heat exchanger, and natural or forced cooling air serves as the horizontal cross-flow for the heat exchanger. In a proposed embodiment, at least one heat pipe is used to transfer heat from the condensation portion of a vapor chamber to cool a first end of a finned heat dissipation space and transfer the heat to a colder location on the same heat fin structure. As a result, the average surface temperature of the fins is increased, part of the thermal resistance in the fins is bypassed, and the efficiency of the thermal management device under the same environmental conditions is increased. In yet another proposed embodiment, the vapor chamber is placed in a heat sink and is adapted to thermally connect with at least one heat pipe. The heat pipe also transfers heat from the vapor chamber to a colder section of the heat dissipation space and cools the bottom portion of a finned heat dissipation space, bypasses part of the thermal resistance of the fins, and increases the efficiency of the thermal management device by increasing the average temperature gradient with the cooling air. The heat pipes may alternatively increase the efficiency of the thermal management device by spreading the heat from the vapor chamber to remote locations within the heat sink under the same principles. What is also contemplated amongst other things, is the use of an electrically cooled layer to increase the efficiency of the thermal management device by cooling locally or any other hot spot the heat generating component or improving the thermal efficiency of the device by lowering the thermal interface resistance between the element surfaces by using bonding and soldering techniques such as the use of thermal grease, nanofoils, liquid interface materials, face change materials, and increased contact pressures.

Figure 3:
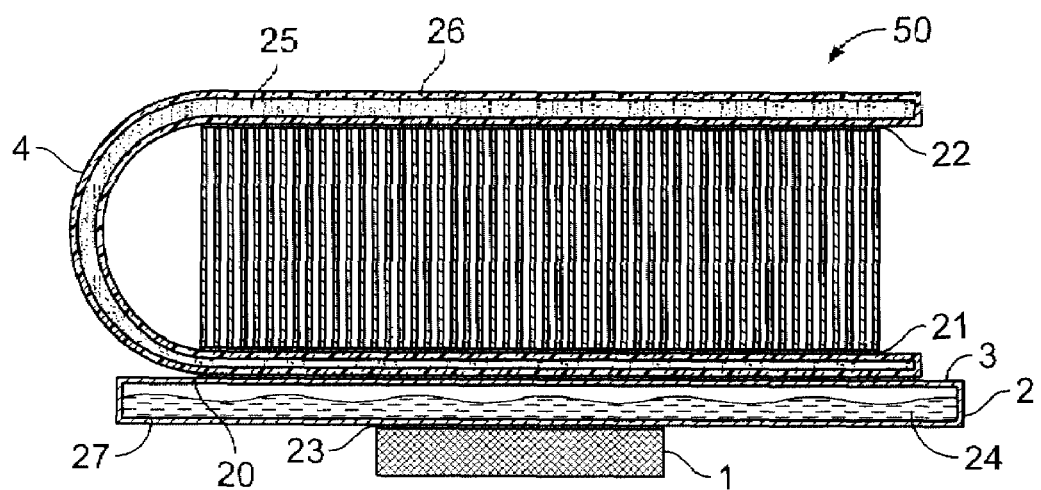
FIG. 3 is a side cross-sectional view of the thermal management device of FIG. 1.
Figure 12:
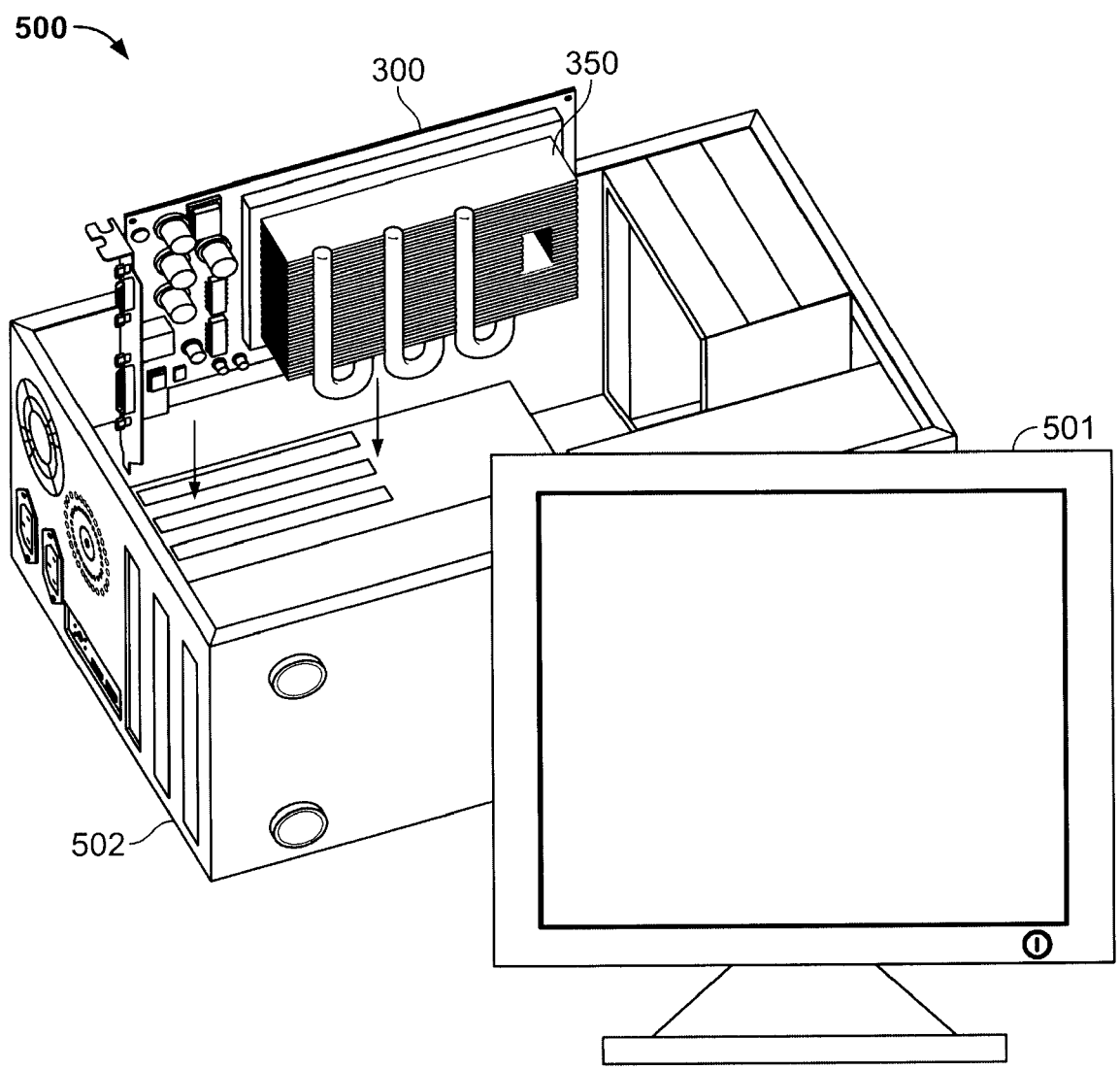
FIG. 12 is three-dimensional isometric view of an example of one of the thermal management device implemented on a circuit assembly constructed in accordance with the teachings of the present disclosure that may be used in a computing device or other device.

Referring to FIG. 1, one embodiment of a thermal management device 50 is used to cool a heat generating component 1 constructed in accordance with the teachings of the present disclosure. In this embodiment, the device 50 includes a vapor chamber 2 having a first evaporation portion 14 and a first condensation portion 3, the first evaporation portion 14 being adapted to thermally couple to the heat generating component 1. Thermal coupling, such as physical contact or the use of a bonding agent 23 shown in FIG. 3, may be placed between the heat generating component 1 and the first evaporation portion 14 to facilitate the conductive heat diffusion from the hotter surface to the colder surface. The heat generating component 1 as the heat source of the thermal management device 50 may be an application-specific integrated chip or any other electronic or optical component that produces heat when operating and that can be mounted on a substrate 300 to be placed, for example, in a personal computer 500 as shown in FIG. 12. One of ordinary skill in the art recognizes that while a single, flat, heat-producing component 1 is shown, what is contemplated in the present disclosure is a thermal management device 50 used to remove heat from any type of surface or topography where heat accumulates and must be drained. A first fluid 24 as shown in FIG. 3 is housed in the vapor chamber 2 adapted to facilitate the conductive and convective heat transfer between the first evaporation portion 14 and the first condensation portion 3 by an evaporation and condensation cycle. The chamber 2 is sealed and contains a working fluid 24, such as water or alcohol or any other fluid 24 based on the operating thermal conditions of the vapor chamber 2. In a preferred embodiment, water is used as a working fluid. The vapor chamber 2 is preferably constructed from a thermally conductive material, such as copper, copper alloys, aluminum, aluminum allows, steel, stainless steel, or the like. The fluid 24 settles over the heated surface in contact with the heat generating component 1. The fluid 24 evaporates on the first evaporation section 14 of the chamber volume. The fluid then contacts a colder section of the vapor chamber 2 and condensate, releasing the heat onto the first condensation section 3. The process of evaporation and condensation of a fluid 24 induces additional convective fluidic movements in the fluid 24 associated with bubbling and pearling of the fluid 24. A heat dissipating structure defines a heat dissipation space 6 adapted to thermally couple to a first end to the first condensation portion. In a preferred embodiment, the heat dissipating structure comprises a plurality of fins 5 cooperatively defining a heat dissipation space 6, but one of ordinary skill in the art understands that any heat dissipating structure such as, but not limited to a heat sink, a heat pipe, a vapor chamber, or the like is contemplated. Returning to FIG. 1 in the embodiment shown, a plurality of fins 5 cooperatively defining a heat dissipation space 6 is adapted to thermally couple to a first end 9 of the first condensation portion 3 of the vapor chamber 2. The fins 5 are shown as thin, flat layers of conductive material arranged to facilitate the passage of natural or forced air over each surface. FIG. 1 shows only one possible configuration of fins 5 defining a heat dissipation space 6. It is understood by one of ordinary skill in the art that while a possible fin configuration is shown, other configurations with different design parameters are also contemplated. By way of nonlimiting example, the design parameters of a heat dissipation space 6 may include the conductivity of materials, the surface finish of the fins, the coating of the fins, the location of the air intake, the interstitial distance between the fins, the surface orientation of the fins, the geometry of the fins, the thermal capacitance of the fins, etc. What is contemplated is a device, assembly and method of manufacturing thereof where heat pipes 4 are either thermally coupled or fluidly coupled to the chamber 2 to diffuse heat. It is understood by one of ordinary skill in the art that while two possible embodiments are described, a first where a single fluid is used in the chamber 2 and the heat pipe 4, and a second where two fluids are used, what is contemplated is the use of vapor chamber technology in either a single mechanical structure, two structures thermally connected of any combination of water vapor chamber systems. As a non-limiting example, a heat pipe 4 can be an assembly of cells placed in succession to allow heat to be transported along the pipe.

Heat diffuses from the first condensation section 3 of the vapor chamber 2 to the first end 9. A first quantity of heat then diffuses by conduction in the heat dissipation space 6. At least one heat pipe 4, shown in FIG. 1 in a preferred embodiment as three heat pipes, is used as a secondary means of heat transfer to diffuse heat from the first condensation interface 3 to the heat dissipation space 6. The heat pipes 4 have a second evaporation section 15 thermally coupled to the first condensation section 3 and a second condensation section 16 thermally coupled to the heat dissipation space 6. FIG. 1 shows three U-shaped heat pipes 4 diffusing heat from the bottom section of the heat dissipation space 6 to the top of the heat dissipation space 6. The use of heat pipes 4 provides alternate paths for heat to diffuse to the heat dissipation space 6, where it is ultimately released by natural or forced convection in the air. The heat pipes 4 effectively increase the local temperature of the fins 5 and increase the efficiency of the thermal management device 5. The heat pipes 4 house a second fluid 25, as shown in FIG. 3, which is adapted to facilitate heat transfer between the second evaporation section 15 and the second condensation portion 16 by an evaporation and condensation cycle.

Figure 2:
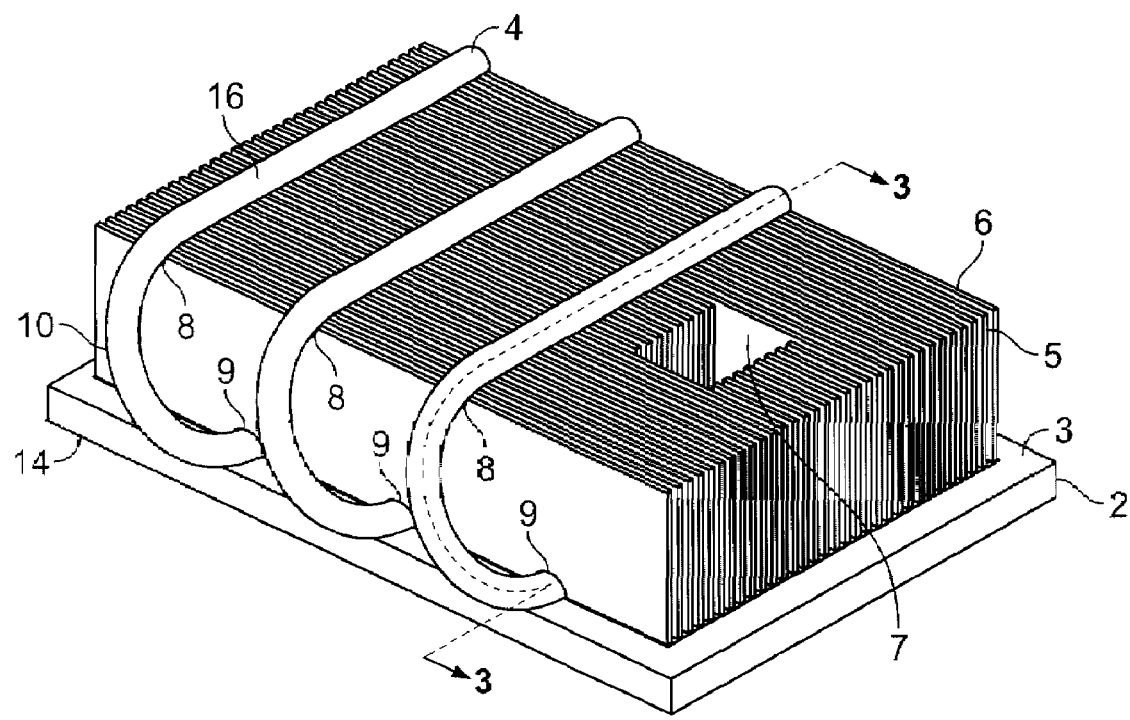
FIG. 2 is a three-dimensional isometric view of the thermal management device of FIG. 1.

One of ordinary skill in the art readily appreciates that while the use of U-shaped heat pipes is shown, what is contemplated is the use of linear vapor chambers able to transport heat between two locations having any shape, size, or geometry. It is also readily appreciated that while the heat pipes 4 are thermally coupled to the bottom and top of the heat dissipation space 6, what is disclosed is the transfer of heat from the first evaporation portion 14 to any location within the heat dissipation space 6 where heat can be transported to increase overall efficiency of the thermal management device 50. FIG. 1 shows a possible mechanical fixation system of the different elements of the thermal management device 50 where what is illustrated as a single screw 11 with fillets 12 is used to secure the heat dissipation space 6 to the vapor chamber 2 at a fixation location 13 on the vapor chamber 2. A hole 7 is also made in the heat dissipation space 6 to allow the passage of the screw 11. As shown in FIG. 2, the U-shaped heat pipes 4 are locked into positions 8 and 9 due to their shape around the heat dissipation space 6. One of ordinary skill in the art readily appreciates that what is shown is only one possible fixation means by which the physical elements of the thermal management device 50 may be assembled. What is contemplated is the use of any known fixation means such as soldering, bonding, clipping, energizing, magnetizing, holding, sliding, or encasing of the different elements into place or any combination thereof.

FIG. 2 is a three-dimensional isometric view of the thermal management device according to the embodiment shown in FIG. 1. FIG. 3 is a side cross-sectional view of the thermal management device shown in FIG. 1 along the cut line 3-3 shown on FIG. 2. FIG. 3 illustrates a stacked configuration the elements forming the thermal management device 50. Some features from the device shown on FIG. 1 are better shown on FIG. 3. The heat pipes 4 in the preferred embodiment may be flattened 28 at one end as shown on FIG. 1 to offer a better thermal contact surface with the vapor chamber 2. In this embodiment, the second evaporation section 15 is also shown as flattened on the upper part in contact with the heat dissipation space 6. One of ordinary skill in the art readily appreciates that the flattening of the top surface and the bottom surface is used to create a surface for the optimal use of thermal bonding enhancers. FIG. 3 shows thermal interfaces 20, 21, 22, and 23 located between the different elements described above. In one preferred embodiment, ordinary solder is used to thermally couple the different elements of the thermal management device. In another embodiment, a soldering enhancer is used to serve as electrical and/or thermal stimuli as an energy-activated local heat source melting solder on either side of the foil and bonding the two soldering components on each side at lower temperatures. A commercial example of the energy-activated soldering enhancer in the form of a foil is NanoFoil® manufactured by Reactive NanoTechnologies Inc. where nanotubes are made of nickel and aluminum in a multilayer arrangement. The use of the electrical soldering enhancer allows for the change or optimization of the type of solder used. In the commercial product previously disclosed, NanoFoil® allows for the replacement of lead and tin solder with gold and tin solder, which in turn allows for subsequent reflow steps without degradation in bonding strength. In a best mode, the energy-activated soldering enhancer is preferentially used on flat surfaces such as the interface between the vapor chamber 2 and the heat dissipation space 6 or the flattened portion 28 of the U-shaped heat pipe 4 and the heat fins 5.

Figure 4:
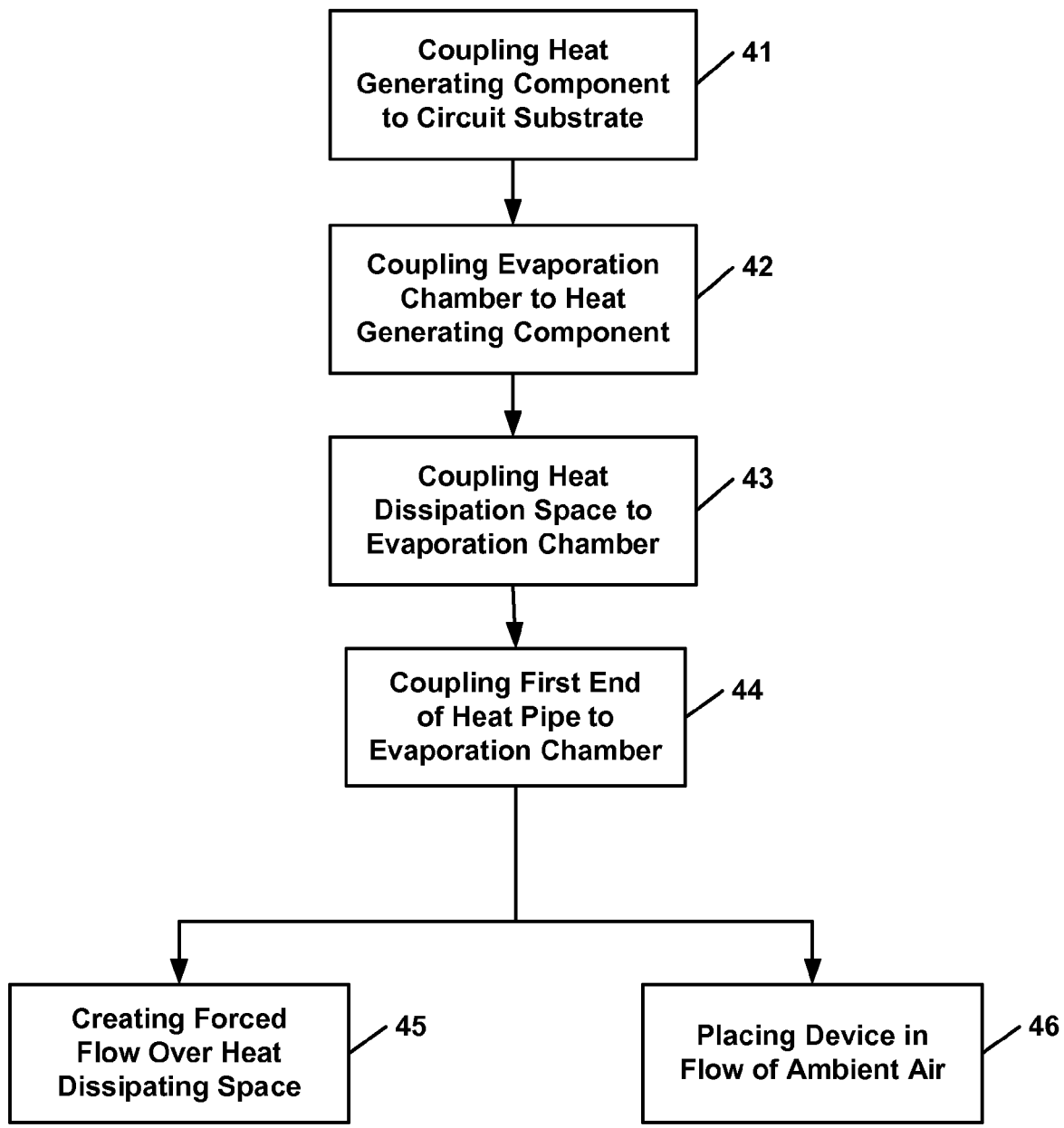
FIG. 4 is a flowchart of a method for manufacturing a circuit assembly equipped with a thermal management device shown on FIG. 1.

FIG. 4 shows a flowchart illustrating a method for manufacturing a circuit assembly equipped with a thermal management device as shown in FIGS. 1 to 3. The method includes the functional coupling 41 of the heat generating component 1 to the circuit substrate 300, the thermal coupling 42 of the vapor chamber 2 to the heat generating component 1 using a first thermal coupler 23 to conductively diffuse heat from the heat generating component 1 to the evaporation vapor chamber 2, the thermal coupling 43 of the finned heat dissipation space 6 to the evaporation vapor chamber 2 using a second thermal coupler to conductively diffuse a first quantity of heat from the evaporation vapor chamber 2 to the finned heat dissipation space 6, the thermal coupling 44 of the first end of the heat pipe 15 to the evaporation vapor chamber 2 using a third thermal coupler 20, and the thermal coupling 22 the second end of the heat pipe 16 to the finned heat dissipation space 6 to conductively and convectively diffuse a second quantity of heat from the vapor chamber 2 to the finned heat dissipating space 6. In an alternate embodiment, the method further includes the action of creating a flow of ambient air 45 over the finned heat dissipating space 6 to increase the convective heat drain from the finned heat dissipating space 6. In another alternate embodiment, the method further includes the action of placing 46 the circuit assembly 300 in a flow of ambient air to increase the convective heat drain from the finned heat dissipating space 6. One of ordinary skill in the art readily appreciates that the creation of a forced flow of ambient air may be achieved in a plurality of ways, but a preferred way is the use of a electrical air mover such as a fan, a blower, a synthetic jet as manufactured by Innovative Fluidics, Inc. or the like. In the alternate embodiment, the circuit assembly can be placed next to an existing forced air flow or can be made to operate only in specific minimum atmospheric conditions. By way of nonlimiting example, the circuit assembly 300 can be mounted on a moving object in relationship with the air or placed in a refrigerated environment.

Except as otherwise shown or described below and with reference to FIGS. 1-3, the descriptions and interrelationships of the constituent elements of the embodiment described above, along with the equivalences and understandings from those of ordinary skill in the art, apply equally to the further embodiments illustrated with reference to FIGS. 5-7, 9-10, and 12 as described hereunder. Several conceptually similar elements have been renumbered on alternate figures for convenience purposes only.

Figure 5:
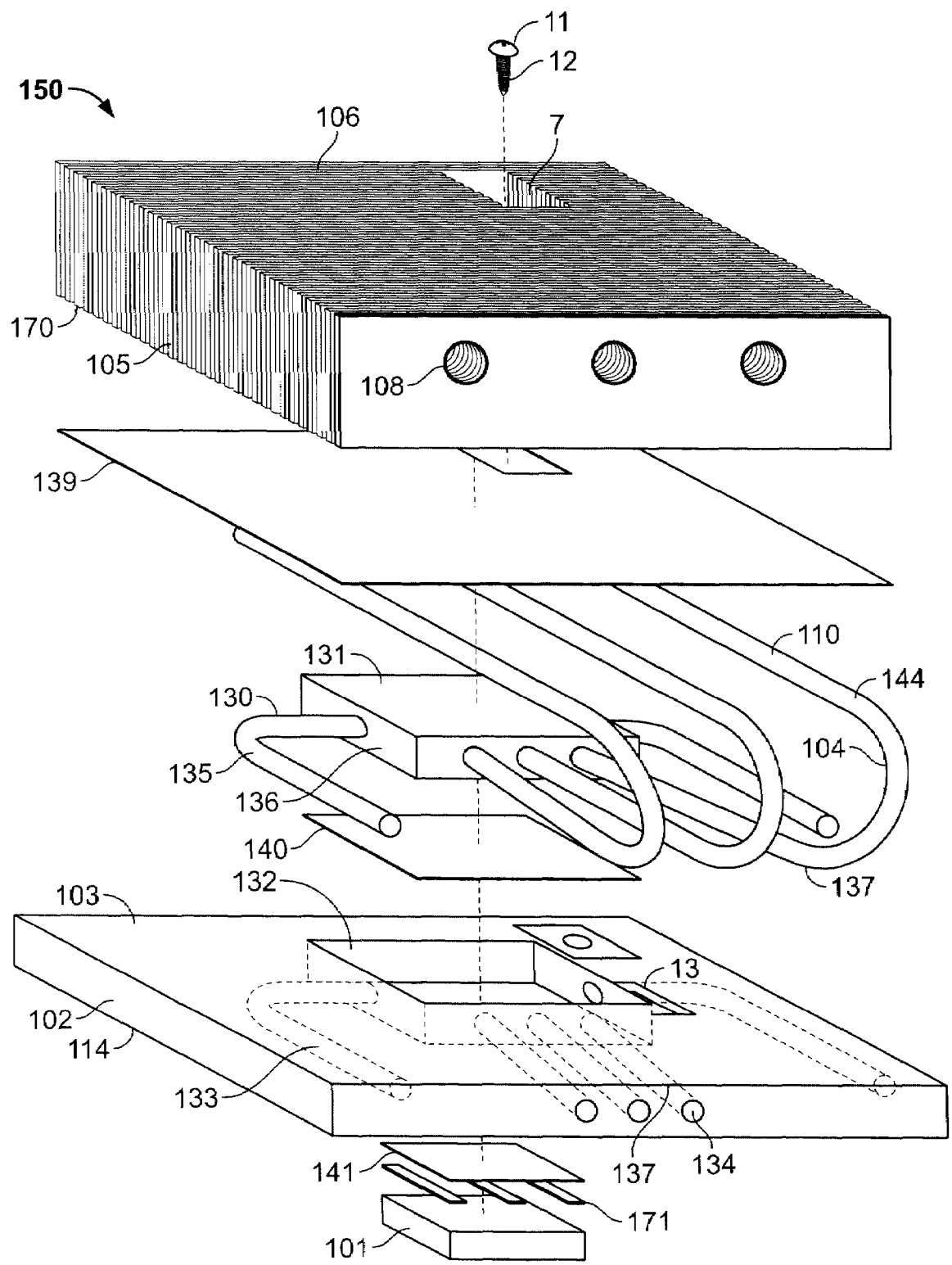
FIG. 5 is a three-dimensional exploded view of a thermal management device of another possible embodiment in accordance with the teachings of the present disclosure.

Referring to FIG. 5, another embodiment of a thermal management device 150 is shown. The thermal management device 150 as a circuit assembly 250 includes a heat generating component 101. The thermal management device 150 includes a heat sink 102 adapted to thermally couple to the heat generating component 101, a chamber 131 comprising a first evaporation portion 140 as shown on FIG. 7, and a first condensation portion 143, the first evaporation portion 140 adapted to thermally couple to the heat sink 102. The thermal management device 150 further includes a plurality of fins 105 cooperatively defining a heat dissipation space 106 adapted to thermally couple to a first end 170 of the heat sink 102, and at least one heat pipe 104 is with a second evaporation portion 137 and a second condensation portion 144, the second evaporation portion 137 functionally coupled the chamber 131 and the second condensation portion 144 adapted to thermally couple in the heat dissipation space 106. The chamber 131 and the at least one heat pipe 104 contains a fluid 142 adapted to facilitate heat transfer between the first and second evaporation portions 140, 137 and the first and second condensation portions 143, 144 by an evaporation and condensation cycle.

Figure 7:
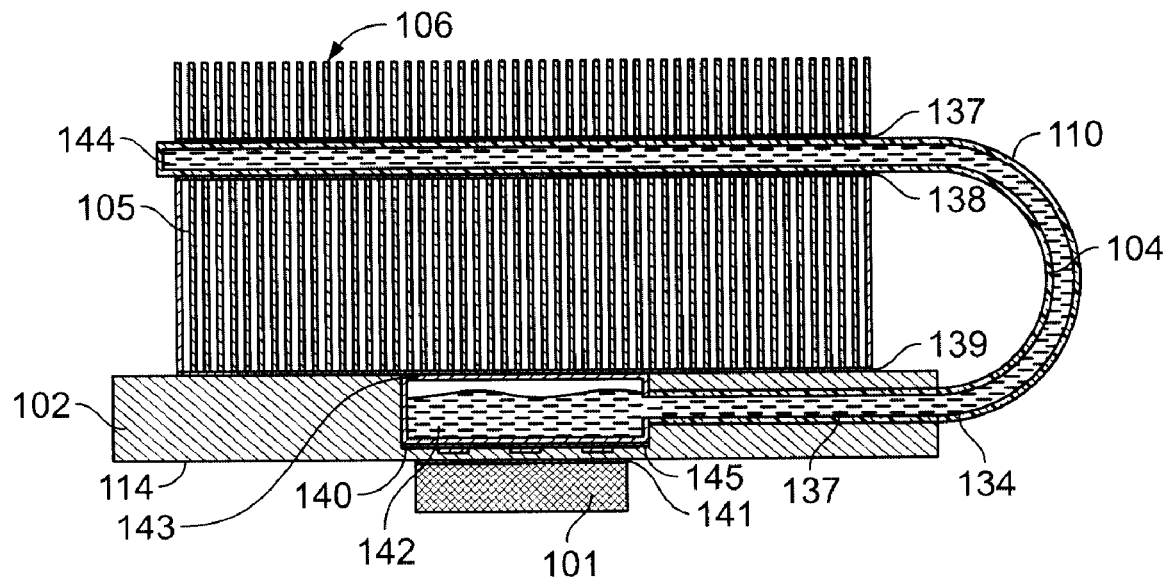
FIG. 7 is a side cross-sectional view of the thermal management device of FIG. 5.

What is shown in FIGS. 5 and 7 is a thermal management device 150 where the heat in a heat generating component 101 is drained via conduction into either the chamber 131 or drained into a heat sink 102. While FIGS. 5 and 7 show an embodiment where the chamber 131 is housed in the heat sink 102, it is understood by one of ordinary skill in the art that the chamber 131 that the portion of the heat sink located between the chamber 131 and the heat generating component 101 may be removed or placed above the chamber 131 below the heat dissipation space 106. What is also conceived is an embodiment where the geometry of the heat sink is either reduced or altogether removed in association with the geometry of the heat dissipation space 106. One of ordinary skill in the art understands that thermal capacitance of the elements associated with the disclosed heat sink may be viewed as the thermal capacitance of the chamber 131. The chamber 131 is preferably constructed from a thermally conductive material such as copper, copper alloys, aluminum, aluminum allows, steel, stainless steel, or the like. The fluid 142 settles over the heated surface in contact with the heat generating component 101 and the heat sink 102. The fluid 142 evaporates on the first evaporation section 140 of the chamber volume. The fluid 142 also evaporates in the second evaporation portion 137 functionally coupled to the chamber 131, and the fluid 142 then contacts a colder section of the chamber 131 or the heat pipe 110 and condenses in the chamber condensation portion 143 or the second condensation portion 144 in the heat pipe 110. The process of evaporation and condensation of a fluid 142 induces additional convective fluidic movements in the fluid 142 associated with bubbling and pearling.

Returning to FIG. 4, a plurality of fins 105 cooperatively defining a heat dissipation space 106 is adapted to thermally couple to a first end 139 of the first condensation portion 143 of the chamber 131. The fins 105 as shown are thin, flat layers of conductive material arranged to facilitate the passage of natural or forced air over each surface. What is shown in FIG. 4 is only one possible configuration of fins 105 defining a heat dissipation space 106. It is understood by one of ordinary skill in the art that while one possible fin configuration is shown, other configurations with different design parameters are also contemplated. By way of nonlimiting example, these design parameters may include the conductivity of a material, the surface finish of the fin, the coating of the fins, the location of the air intake, the interstitial distance between the fins, the surface orientation of the fins, the geometry of the fins, etc.

Heat from the chamber 131 is either sent to the first condensation section 143, sent to the second condensation section 144 by the vapor cycle, or laterally diffused to the heat sink 102. A quantity of heat then diffuses by conduction to the heat dissipation space 106 after thermal conduction with the heat sink 102, and a second quantity of heat then diffuses to the heat dissipation space 106 from the second condensation section 143. At least one heat pipe 110, shown on FIG. 4 as three heat pipes, is used as a secondary means of heat transfer to diffuse heat from the first condensation section 143 to the heat dissipation space 106. The heat pipes 110 have a second evaporation section 144 thermally coupled to chamber 131. FIG. 4 shows U-shaped heat pipes 110 diffusing heat from the bottom section of the heat dissipation space 106 to the upper section of the heat dissipation space 106. The use of heat pipes 110 provides alternate paths for the heat to diffuse to the heat dissipation space 106 where heat is ultimately released by natural or forced convection in the air. The heat pipes 110 effectively increase the local temperature of the fins 105 and increase the efficiency of the thermal management device 105. The heat pipes 110 house the same fluid 142 shown in FIG. 7 adapted to facilitate heat transfer between the first and second evaporation sections 140, 137 and the first and second condensation portions 143, 144 by an evaporation and condensation cycle.

Figure 6:
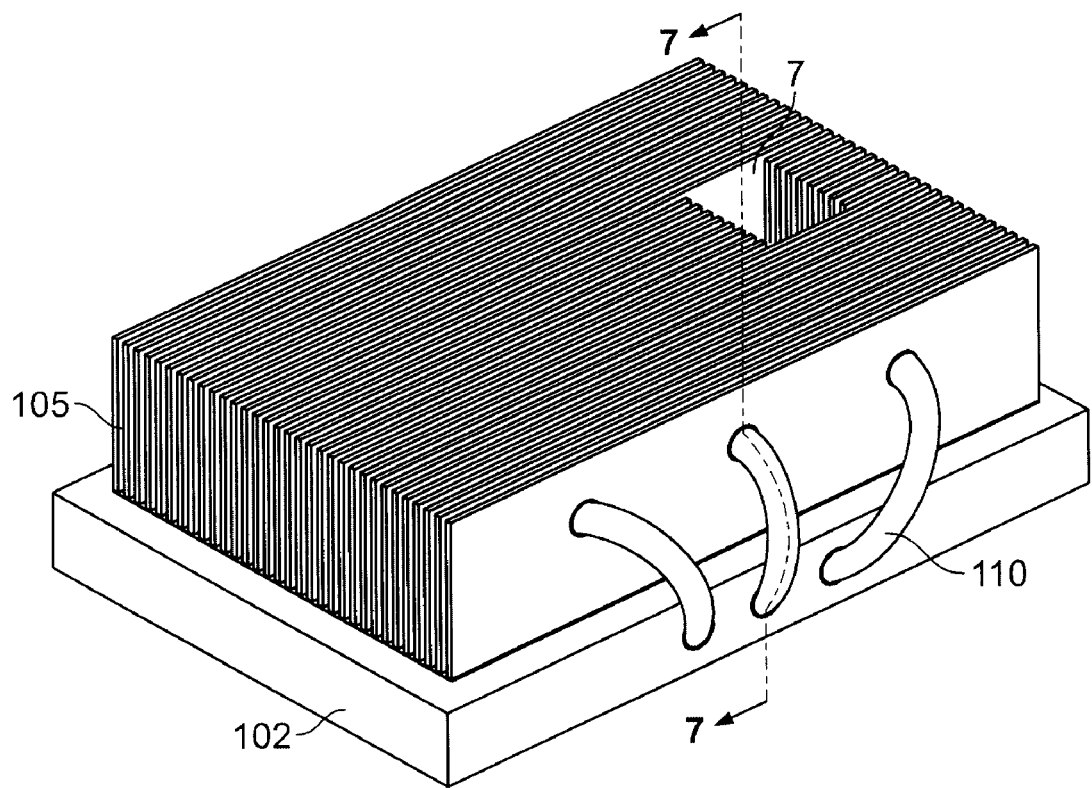
FIG. 6 is a three-dimensional isometric view of the thermal management device of FIG. 5.

One of ordinary skill in the art readily appreciates that while the use of U-shaped heat pipes is shown, what is contemplated is the use of linear vapor chambers having any shape, size or geometry while being able to transport heat between two locations. It is also readily appreciated that while the heat pipes 110 are thermally coupled between the chamber 131 and the upper portion of the heat dissipation space 106, what is disclosed is the transfer of heat from the first evaporation portion 140 to any location within the heat dissipation space 106 where heat can be transported to increase overall efficiency of the thermal management device 150. FIG. 4 shows a possible fixation system of the different elements of the thermal management device 150 where a single screw 11 with fillets 12 is used to secure the heat dissipation space 106 to the chamber 131 at a fixation location 13 on the heat sink 102. A hole 7 is also made in the heat dissipation space 106 to allow the passage of the screw 11. As shown in FIG. 6, the U-shaped heat pipes 110 are locked into position due to their shape interlocking with the heat dissipation space 106. One of ordinary skill in the art readily appreciates that this is only one possible fixation means by which the physical elements of the thermal management device 150 may be assembled. What is contemplated is the use of any known fixation means such as soldering, bonding, clipping, energizing, magnetizing, holding, sliding, and encasing of the different elements into place or any combination thereof.

FIG. 6 is a three-dimensional isometric view of the thermal management device according to the possible embodiment shown in FIG. 5. FIG. 3 is a side cross-sectional view of the thermal management device shown in FIG. 6 along the cut line 7-7 shown in FIG. 6. FIG. 7 illustrates a stacked configuration the elements forming the thermal management device 150. Some features from the device shown on FIG. 5 are better shown on FIG. 7. The heat pipes 110 in the preferred embodiment may be partly located in the heat sink 102 to offer a better thermal contact surface and improve the overall compactness of the thermal management device 150. FIG. 7 shows the thermal interfaces 141, 145, 139, 138, and 139 located between the different elements described above. In one preferred embodiment, ordinary soldering techniques are used to thermally couple the different elements. In another embodiment, a soldering enhancer is used to serve as electrical and/or thermal stimuli as an energy-activated local heat source melting solder on either side of the foil and bonding the two soldering components on each side at lower temperatures. A commercial example of the energy-activated soldering enhancer in the form of a foil is NanoFoil®, manufactured by Reactive NanoTechnologies Inc., where nanotubes are made of nickel and aluminum in a multilayer arrangement. The use of the electrical soldering enhancer allows for the replacement of the type of solder used. In the commercial product previously disclosed, NanoFoil® allows for the replacement of lead and tin solder with gold and tin solder, which then allows for subsequent reflow steps without degradation in bonding strength. In a best mode, the energy-activated soldering enhancer is preferentially used on flat surfaces such as the interface between the chamber 131 and the heat sink 102, the chamber 131 and the heat dissipation space 106, or the heat sink 102 and the heat dissipation space 106.

In an alternate embodiment, the size of the heat sink 102 is sufficiently large, when compared with the size of the chamber 131, that the chamber 131 may further comprise at least one heat conduit 133 encased in the heat sink 102 and where the heat conduit 133 contains a fluid 142 in fluidic communication with the fluid 142 in the chamber 131 adapted to facilitate heat transfer between the heat sink 102 and the heat dissipation space 106 by an evaporation and condensation cycle. FIG. 7 shows two laterally disposed heat conduits 134, but it is understood by one of ordinary skill in the art that the object of these heat conduits 133 is to better spread the heat from the heat generating component 101. An embodiment contemplated but not shown includes, as a nonlimiting example, the use of a heat sink 102 of sufficient thickness to contemplate heat conduits 133 in different orientations. While an embodiment where the chamber 131 is shown in a rectangular geometry, what is contemplated is the use of a chamber 131 of trapezoidal shape where the bottom section may be broader than the top section, or where the lateral walls and a section of the chamber 131 are protruded vertically or at an angle from the vertical to increase the effective contact area of the fluid with the evaporation section and the vapor with the condensation section.

In another alternate embodiment, the thermal management device 150 further includes at least one electrically cooled layer 171 adapted to thermally couple to the heat generating component 101. A commercial example of the electrically cooled layer 171 is a superlattice from Nextreme Thermal Solutions, Inc. The electrically cooled layer 171 is a localized cooler that allows the removal of localized heat on a surface. One of ordinary skill in the art understands that while a linear strip of electrically cooled material is shown 171, the localized cooler can be made to any shape or geometry suitable for localized cooling in a specific location where excess heat must be drained. The electrically cooled layer in one embodiment is placed preferentially at the thermally coupled interface between the heat generating element 101 and the chamber 131. In yet another preferred embodiment, the heat dissipation space 106 is also thermally coupled to a first end 139 of the chamber 131 and/or the heat sink 102.

Figure 8:
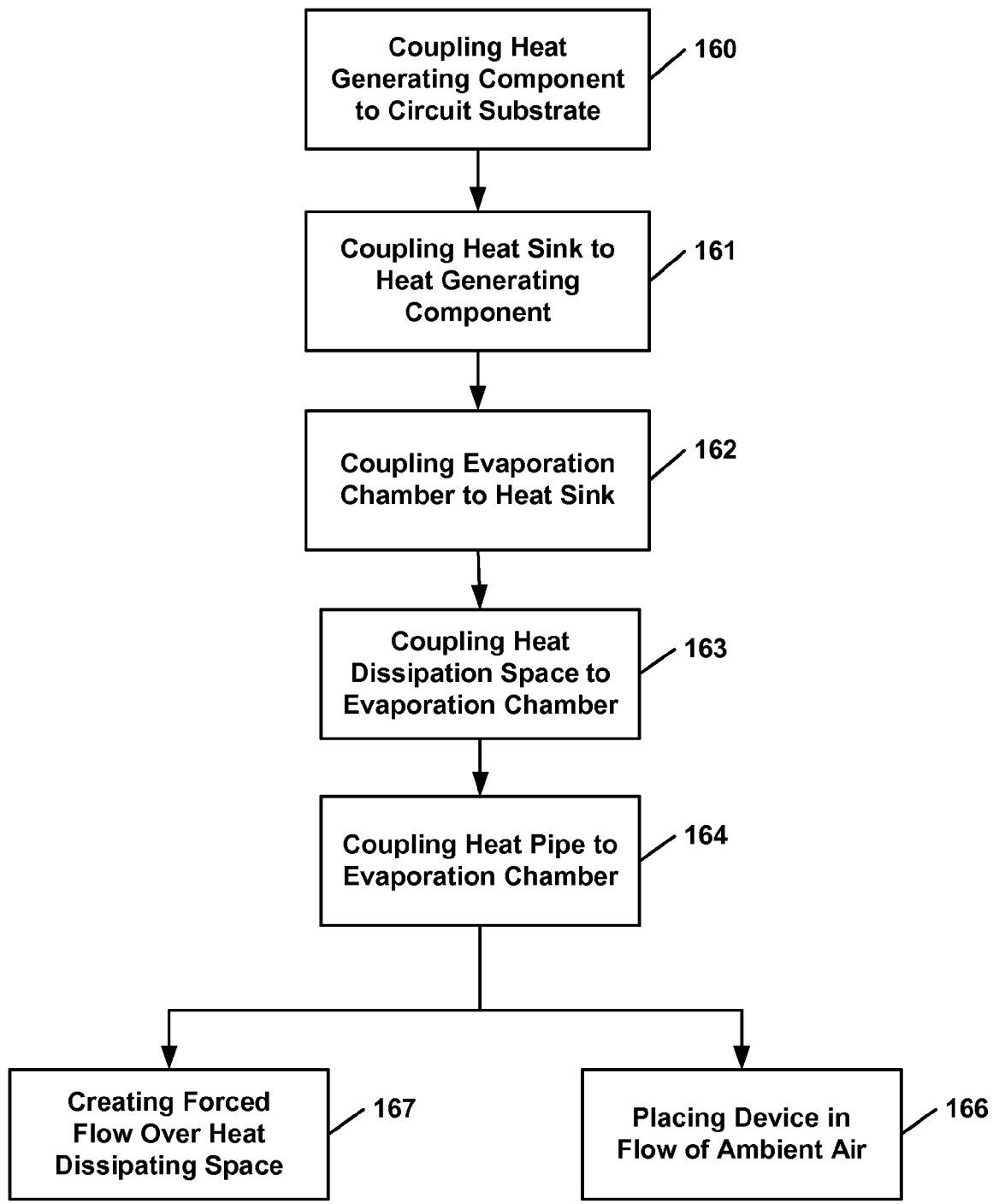
FIG. 8 is a flowchart of a method for manufacturing a circuit assembly equipped with a thermal management device shown on FIG. 5.

FIG. 8 is a flowchart illustrating a method of manufacturing a circuit assembly equipped with a thermal management device as shown in FIGS. 5-7. The method includes functionally coupling 160 a heat generating component 101 to a circuit substrate 300, thermally coupling 161 the heat sink 102 to the heat generating component 101 using a first thermal coupler 141 to conductively diffuse heat from the heat generating component 101 to the heat sink 102, thermally coupling 162 the evaporation chamber 131 to the heat sink 131 using a second thermal coupler 141 to conductively and convectively diffuse heat from the heat sink 102 to the evaporation chamber 131, thermally coupling 163 the finned heat dissipation space 106 to the evaporation chamber 131 using a third thermal coupler 139 to conductively diffuse a first quantity of heat from the evaporation chamber 131 to the finned heat dissipation space 106, thermally and fluidically coupling 164 the first end 137 of the heat pipe 110 to the evaporation chamber 131, and thermally coupling the second end of the heat pipe 144 to the finned heat dissipation space 106 to conductively and convectively diffuse a second quantity of heat from the evaporation chamber 131 to the finned heat dissipating space 106.

In an alternate embodiment, the method further includes creating a flow of ambient air 166 over the finned heat dissipation space 106 to increase the convective heat drain from the finned heat dissipating space 106. In yet another alternate embodiment, the method further includes placing the circuit assembly 300 in a flow of ambient air to increase the convective heat drain from the finned heat dissipating space 106. One of ordinary skill in the art readily appreciates that the creation of a forced flow of ambient air may be achieved in a plurality of ways, but a preferred manner is the use of a small fan equipped with an electrical motor. In an alternate embodiment, the circuit assembly can be placed next to an existing forced air flow or can be made to operate only in specific minimum atmospheric conditions. By way of nonlimiting example, the circuit assembly 300 can be mounted on a moving object in relationship with the air or placed in a refrigerated environment.

Figure 9:
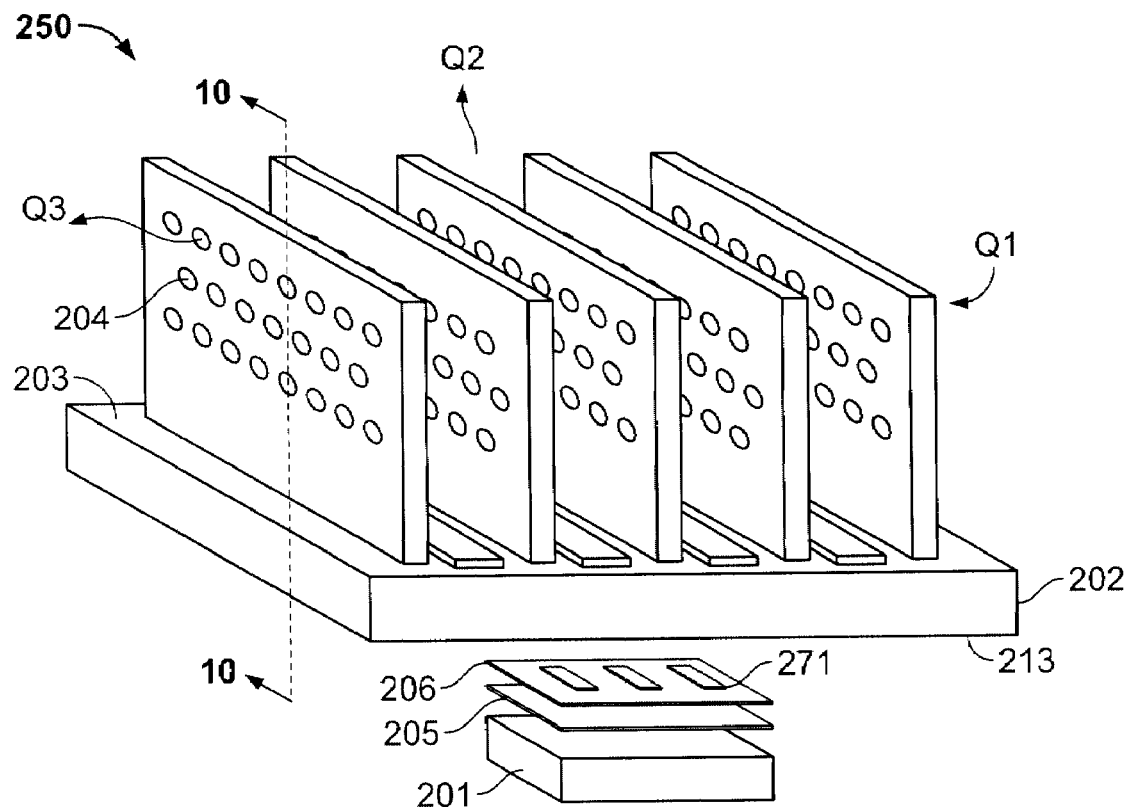
FIG. 9 is a three-dimensional isometric view of a thermal management device of yet another possible embodiment in accordance with the teachings of the present disclosure.
Figure 10:
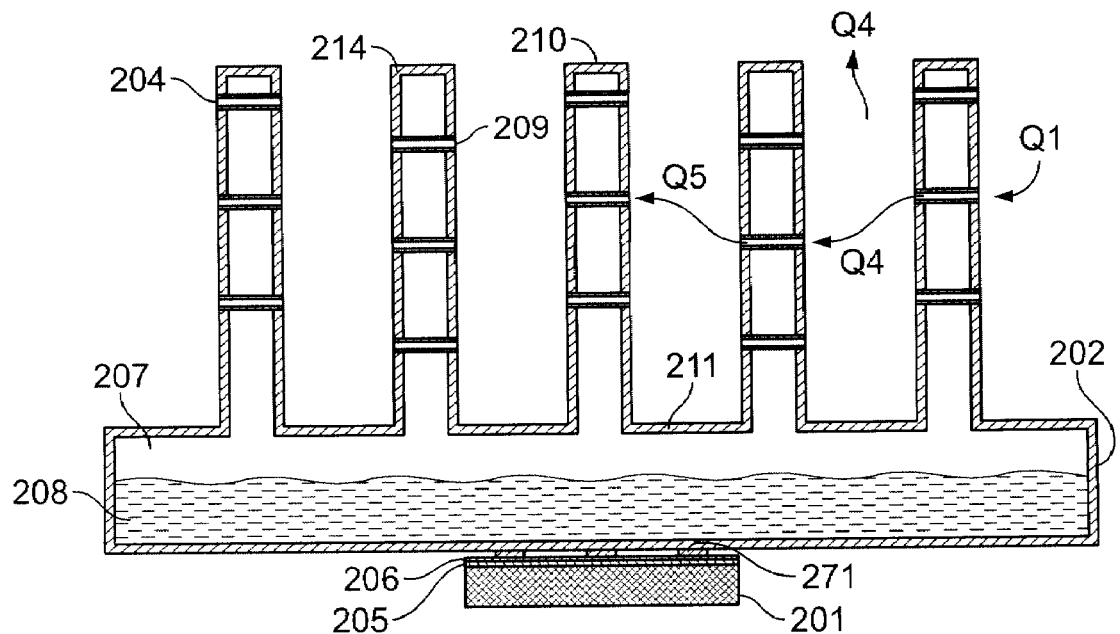
FIG. 10 is a front cross-sectional view of the thermal management device of FIG. 9.

FIG. 9 shows a three-dimensional isometric view of a thermal management device in accordance with the teachings of the present disclosure according to another embodiment. FIG. 10 is a front cross-sectional view of the thermal management device of FIG. 9 along the line 10-10. The thermal management device 250 includes a chamber 202 having a first evaporation portion 213, a first condensation portion 203, and a plurality of fins 210 in fluidic communication with the chamber 202 cooperatively defining a heat dissipation space 214. In a preferred embodiment as shown in FIG. 10, the fluid 208 is water. The fluid is housed in at least the chamber 202 and the inside portion of the fins 210 that further comprise a plurality of cross-flow heat exchanger tubes 204. It is understood by one of ordinary skill in the art that the fins 210 are an extension of the chamber 202 where fluid vapor rises vertically around the tubes 204 and moves in a cross flow around the surface of the tubes 204. The principle of a cross-flow exchanger is to allow two fluids or gases at different temperatures to travel separately on each side and transfer heat by convection and conduction in a separating wall 211 of large surface. Once evaporated, the fluid 208 travels up the fins 210 and is cooled in contact with the fin conductive walls 211 before returning as a fluid by gravity to the chamber 202. One of ordinary skill in the art recognizes that while air cooling is preferred as the fluid located on the external surface of the fins 210, the use of a fluid such as water is also contemplated.

Air or forced air shown as Q1, illustrated arbitrarily on the right side of FIGS. 9-10, may travel through the fins 210 until reaching the other side as Q3. Part of the air heated by contact with the hotter fins 210 may rise as Q2, forcing lateral secondary flows of cooling air between the fins 210. FIG. 10 illustrates how the tubes 204 may be staggered on the same fin 210 or between fins in order to impose movement in the air shown as Q4 and Q5. It is understood by one of ordinary skill that cooling of a fluid by convection action of a fluid outside of a plurality of cross-flow exchangers located vertically does not require undue experimentation but only requires the calibration of normal parameters as the convective flow of air such as the location of a fan, the angle of incidence of a fan, or the like.

In a preferred embodiment, the tubes 204 are hollow cylinders placed in a staggered configuration over the surface of the fins. The tubes 204 may be staggered along the successive rows, columns, or both. What is shown in FIG. 9 is a configuration where tubes 204 are staggered along rows, columns, and between successive fins 210. In an alternate embodiment, the thermal management device 250 further includes at least one electrically cooled layer 271 adapted to thermally couple to the heat generating component 201. The electrically cooled layer 271 is a localized cooler that allows the removal of localized heat on a surface. One of ordinary skill in the art understands that while a linear strip of electrically cooled material 271 is shown, the localized cooler can be made to any shape or geometry suitable for localized cooling in a specific location where excess heat must be drained. In one preferred embodiment, the electrically cooled layer is placed at the thermally coupled interface between the heat generating component 201 and the chamber 202. In yet another preferred embodiment, the thermal management device is mounted as part of a circuit assembly where the circuit assembly 300 further includes a solder material 205 located between the chamber 202 and the heat generating component 201. The solder material may further comprise an energy-activated multilayer foil 206. In a preferred embodiment, the foil is made of nickel and aluminum. A commercial example of a cross-flow heat exchanger that may be used as fins 210 is a cylindrical microchannels MCHX panel of high density array from Mezzo Technologies developed from DARPA at Louisiana State University. Other microchannel heat exchanger panels are also contemplated.

Figure 11:
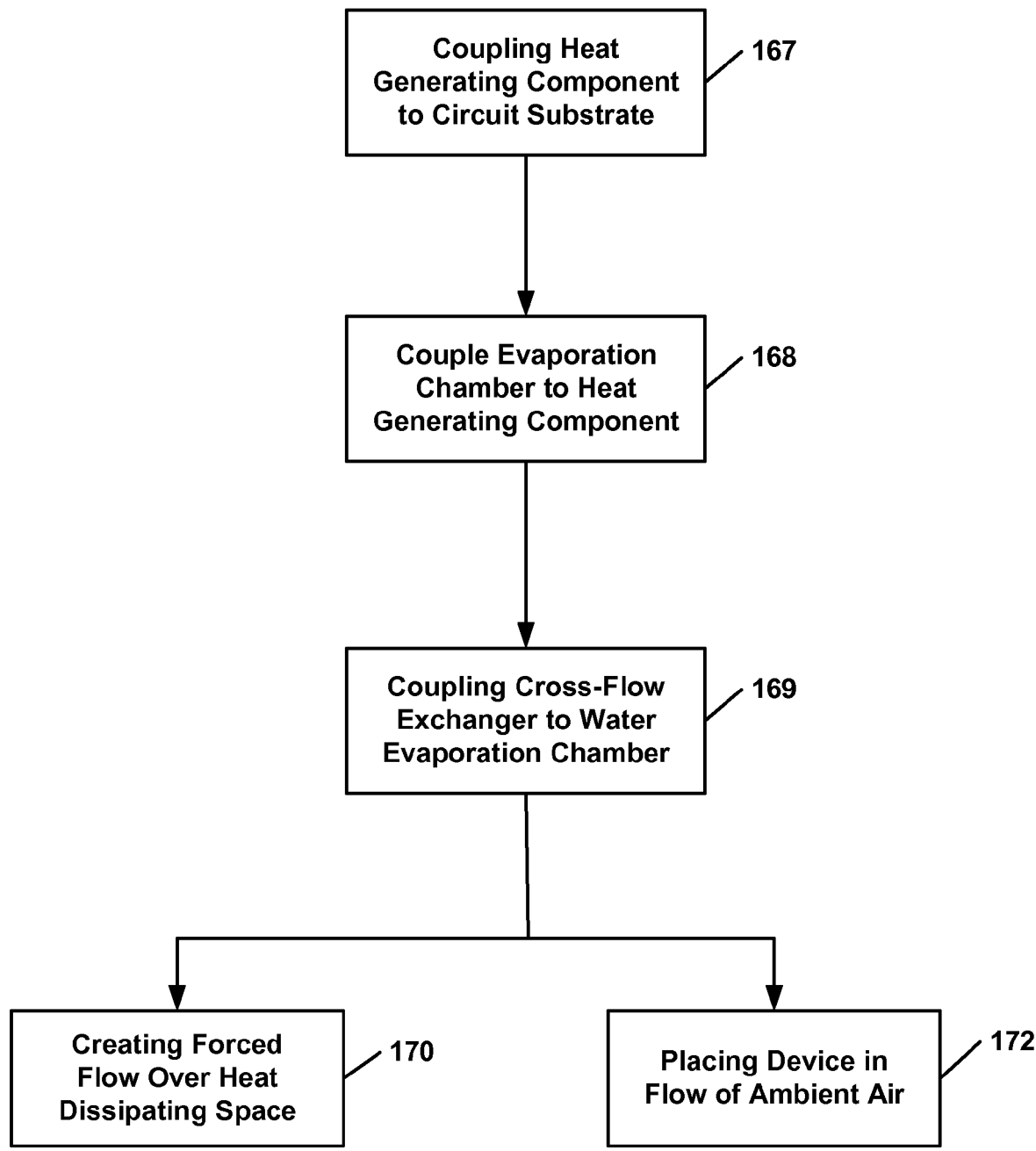
FIG. 11 is a flowchart of a method for manufacturing a circuit assembly equipped with a thermal management device shown on FIG. 9.

FIG. 11 is a flowchart of a method of manufacturing a circuit assembly equipped with a thermal management device shown in FIG. 9. The method of manufacture of a circuit assembly includes a circuit substrate, a heat generating component, and a thermal management device comprising a evaporation chamber, a plurality of fins defining a cross-flow heat exchanger cooperatively defining a heat dissipation space, and a fluid housed in the chamber, the method comprising functionally coupling the heat generating component to the circuit substrate 167, thermally coupling the evaporation chamber to the heat generating component using a first thermal coupler to conductively and convectively diffuse heat from the heat generating component 201 to the evaporation chamber 168, and thermally coupling the fins defining a cross-flow heat exchanger to the evaporation chamber 169. In an alternate embodiment, the method further includes creating a flow of ambient air 170 over the finned heat dissipating space to increase the convective heat drain from the finned heat dissipating space. In yet another alternate embodiment, the method further comprising 172 placing the circuit assembly 300 in a flow of ambient air to increase the convective heat drain from the finned heat dissipating space. One of ordinary skill in the art readily appreciates that the creation of a forced flow of ambient air may be achieved in a plurality of ways, but a preferred manner is the use of a small fan equipped with an electrical motor. In the alternate embodiment, the circuit assembly can be placed next to an existing forced air flow or can be made to operate only in specific minimum atmospheric conditions. By way of nonlimiting example, the circuit assembly 300 can be mounted on a moving object in relationship with the air or placed in a refrigerated environment.

FIG. 12 is three-dimensional isometric view of an example of one of the thermal management device 50, 150, or 250 implemented on a circuit assembly 300 constructed in accordance with the teachings of the present disclosure that may be used in a computing device 500 or other device.

The invention is not limited to the particular details of the apparatus or method depicted and other modifications and applications may be contemplated. Further changes may be made in the above-described method and device without departing from the true spirit of the scope of the invention herein involved. It is intended, therefore, that the subject matter in the above depiction should be interpreted as illustrative, not in a limiting sense.

What is claimed is:

1. A thermal management device comprising:
a chamber comprising a first evaporation portion and a first condensation portion; and
a plurality of spaced apart fins in fluidic communication with the chamber cooperatively defining a heat dissipation space;
wherein a fluid is housed in at least the chamber and each of the spaced apart fins further comprises a plurality of cross-flow heat exchanger tubes through the fin and wherein the plurality of cross-flow heat exchanger tubes are discontinuous between the plurality of spaced apart fins.

2. A thermal management device comprising:
a chamber comprising a first evaporation portion and a first condensation portion; and
a plurality of fins in fluidic communication with the chamber cooperatively defining a heat dissipation space;
wherein a fluid is housed in at least the chamber and the fins further comprise a plurality of cross-flow heat exchanger tubes through the fin, and wherein the exchanger tubes are hollow cylinders and wherein the plurality of cross-flow heat exchanger tubes are discontinuous between the plurality of spaced apart fins.

3. A thermal management device comprising:
a chamber comprising a first evaporation portion and a first condensation portion; and
a plurality of fins in fluidic communication with the chamber cooperatively defining a heat dissipation space;
wherein a fluid is housed in at least the chamber and the fins further comprise a plurality of cross-flow heat exchanger tubes, and wherein the cross-flow heat exchanger tubes are staggered along rows and columns over the surface of the fins and the cross-flow heat exchanger tubes are configured to allow fluid to flow over the tubes.

4. A thermal management device comprising:
a chamber comprising a first evaporation portion and a first condensation portion; and
a plurality of fins in fluidic communication with the chamber cooperatively defining a heat dissipation space;
wherein a fluid is housed in at least the chamber and the fins further comprise a plurality of cross-flow heat exchanger tubes, and wherein the exchanger tubes are staggered between two successive fins.

5. The thermal management device of claim 1, further comprising at least one electrically cooled layer adapted to thermally couple a heat generating element and the first evaporation section.

6. The thermal management device of claim 5, wherein the at least one electrically cooled layer is comprised of nanowire technology.

7. A circuit assembly comprising:
a circuit substrate;
a heat generating component mounted on the circuit substrate; and
a thermal management device thermally coupled to the heat generating component, the thermal management device comprising:
a chamber comprising a first evaporation portion and a first condensation portion, the first evaporation portion adapted to thermally couple to the heat generating component;
a plurality of spaced apart fins in fluidic communication with the chamber cooperatively defining a heat dissipation space;
wherein a fluid is housed in at least the chamber and each of the spaced apart fins further comprises a plurality of cross-flow heat exchanger tubes through the fin and wherein the plurality of cross-flow heat exchanger tubes are discontinuous between the plurality of spaced apart fins.

8. The circuit assembly of claim 7, further comprising at least one electrically cooled layer adapted to thermally couple to the heat generating component.

9. The circuit assembly of claim 8, wherein the at least one electrically cooled layer is comprised of nanowire.

10. The circuit assembly of claim 7, further comprising a solder material comprising an energy-activated multilayer foil located between the heat generating component and the first evaporation portion.

11. The circuit assembly of claim 7, wherein the cross flow heat exchanger tubes are cylindrical.

12. A circuit assembly comprising:
a circuit substrate;
a heat generating component mounted on the circuit substrate; and
a thermal management device thermally coupled to the heat generating component, the thermal management device comprising:
a chamber comprising a first evaporation portion and a first condensation portion, the first evaporation portion adapted to thermally couple to the heat generating component;
a plurality of fins in fluidic communication with the chamber cooperatively defining a heat dissipation space;
wherein a fluid is housed in at least the chamber and the fins further comprises a plurality of cross-flow heat exchanger tubes, and wherein the tubes are staggered along rows and columns over the surface of the fin.

13. A method of manufacture of a circuit assembly comprising a circuit substrate, a heat generating component, and a thermal management device comprising an evaporation chamber, a plurality of spaced apart fins each further comprises a plurality of cross-flow heat exchanger tubes through the fin, the plurality of spaced apart fins cooperatively defining a heat dissipation space, and a fluid housed in the chamber and wherein the plurality of cross-flow heat exchanger tubes are discontinuous between the plurality of spaced apart fins, the method comprising: functionally coupling the heat generating component to the circuit substrate; thermally coupling the evaporation chamber to the heat generating component using a first thermal coupler to conductively and convectively diffuse heat from the heat generating component to the evaporation chamber; and thermally coupling each of the spaced apart fins defining a cross-flow heat exchanger to the evaporation chamber.

14. The method of claim 13, further comprising creating a flow of ambient air over the spaced apart fins to increase the convective heat drain.

15. The method of claim 13, further comprising placing the circuit assembly in a flow of ambient air to increase the convective heat drain from the fins.

* * * * *